(12) United States Patent
Bates

(10) Patent No.: US 7,710,161 B1
(45) Date of Patent: May 4, 2010

(54) DIGITAL LOW FREQUENCY DETECTOR

(75) Inventor: Colin Bates, Lanark (GB)

(73) Assignee: ATMEL Corporation, San Jose, CA (US)

( * ) Notice: Subject to any disclaimer, the term of this patent is extended or adjusted under 35 U.S.C. 154(b) by 0 days.

(21) Appl. No.: 12/353,158

(22) Filed: Jan. 13, 2009

(51) Int. Cl.
*H03K 5/19* (2006.01)

(52) U.S. Cl. .............................. 327/20; 327/18; 327/47; 327/49; 324/76.55

(58) Field of Classification Search ............. 327/18–21, 327/47–49; 324/76.47, 76.55, 76.58, 76.62
See application file for complete search history.

(56) References Cited

U.S. PATENT DOCUMENTS

| | | | |
|---|---|---|---|
| 4,267,514 A | 5/1981 | Kimsey | |
| 4,366,373 A | 12/1982 | Metcalf | |
| 4,742,424 A | 5/1988 | Kautzer et al. | |
| 4,914,680 A * | 4/1990 | Tanno et al. | 377/49 |
| 5,164,966 A | 11/1992 | Hershberger | |
| 5,175,544 A | 12/1992 | McKeen | |
| 6,545,508 B2 * | 4/2003 | Senba | 327/20 |
| 7,095,259 B2 | 8/2006 | Knotts | |

* cited by examiner

*Primary Examiner*—Lincoln Donovan
*Assistant Examiner*—Patrick O'Neill
(74) *Attorney, Agent, or Firm*—Fish & Richardson P.C.

(57) ABSTRACT

A digital circuit is disclosed for detecting clock activity in an integrated circuit (IC) device. In one implementation, a clock detection circuit can include two flip flops. A first flip flop detects activity on the clock being tested (e.g., the flip flop is set when a positive clock edge is detected). A second flip flop is coupled to the output of first flip flop and is operable by an enable signal to sample the output of the first flip flop. The output of the second flip flop is asserted as active, when a positive clock edge occurs between the release of the reset signal on the first flip flop and the assertion of the enable signal on the second flip flop. In some implementations, one or more additional flips can be interposed between the first and second flips to control metastability.

5 Claims, 4 Drawing Sheets

DIGITAL LOW FREQUENCY DETECTOR

TECHNICAL FIELD

This subject matter relates generally to digital low frequency detectors.

BACKGROUND

A contactless smart card is commonly used for security access or payment systems. Contactless smart cards generally include an antenna, in the form of an inductor, coupled to an integrated circuit (IC). The IC commonly includes a capacitor which forms a resonant circuit with the antenna. A card reader presents an alternating magnetic field that excites the inductor/capacitor resonant circuit, which in turn energizes and powers the IC. The IC can then perform one or more functions, such as transmitting a card number through the antenna to the card reader.

Many smart cards include an integrated circuit (IC) device. The IC device includes various circuits and a central processing unit (CPU) for performing operations on data, including operations on secret data (e.g., manipulating a private key). The CPU can be subjected to an analysis attack by an individual seeking to recover the secret data. For example, an attacker may try to deduce a secret key by measuring various circuit voltages through the IC device, single-stepping the CPU clock, then measuring the circuit voltages again to deduce the operation performed by the CPU and the operand manipulated during the operation.

Conventional solutions to protect against analysis attacks use two low frequency detectors to detect low clock frequencies. A first low frequency detector is connected to a clock pin of the IC chip. A second, low frequency detector is connected to an internal clock. The second low frequency detector is capable of detecting lower clock frequencies than the first low frequency detector. The second low frequency detector typically includes a custom cell delay line which consumes a large area on the IC die. This large footprint can preclude using the second low frequency detector on more than one clock on the IC device.

SUMMARY

A digital circuit is disclosed for detecting clock activity in an IC device. In one implementation, a clock detection circuit can include two flip flops. A first flip flop detects activity on the clock being tested (e.g., the flip flop is set when a positive clock edge is detected). The first flip flop can be reset by a reset signal. A second flip flop is coupled to the output of first flip flop and is operable by an enable signal to sample the output of the first flip flop. The output of the second flip flop is asserted as active, when a positive clock edge occurs between the release of the reset signal on the first flip flop and the assertion of the enable signal on the second flip flop. In some implementations, one or more additional flips can be interposed between the first and second flips to control metastability.

DETAILED DESCRIPTION

Example IC Device with Digital Clock Detect Circuit

Figure 1:
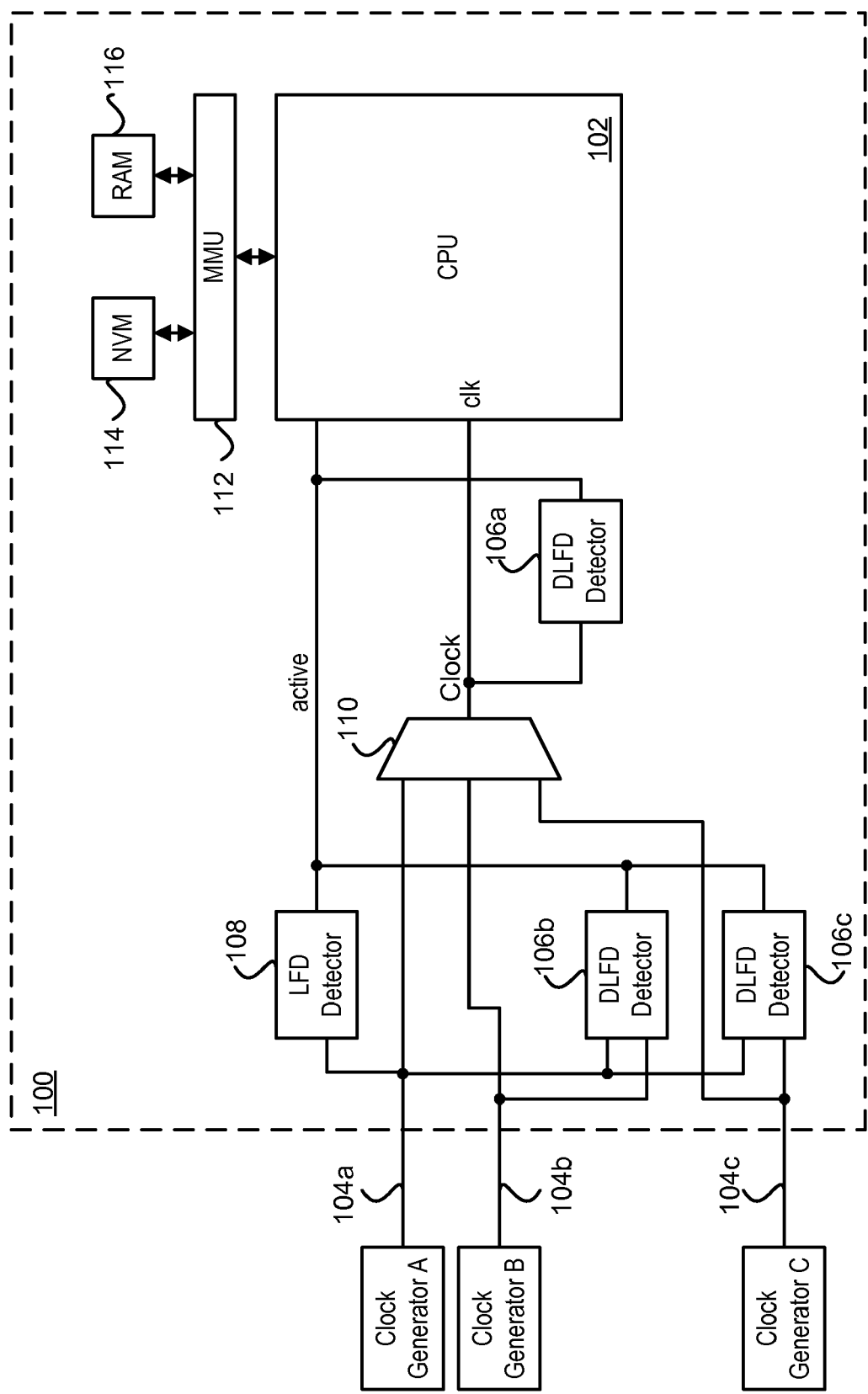
FIG. 1 is a block diagram of an example IC device for an IC device, including a clock detect circuit.

FIG. 1 is a block diagram of an example IC device 100 for an electronic device (e.g., a contactless smart card), including a digital low frequency detector (DLFD). In some implementations, the IC device 100 includes a central processing unit (CPU) 102, one or more clock inputs 104, one or more DLFD (s) 106, a low frequency detector (LFD) 108, a multiplexer 110, a memory management unit 112, non-volatile memory 114 (e.g., EEPROM, ROM) and volatile memory 116 (e.g., RAM). Other components can be included in the IC device 100 but are not shown for clarity purposes.

The CPU 102 performs various operations for the electronic device. In the case of a contactless smart card, the CPU 102 can demodulate input signals, modulate output signals and perform cryptographic operations on secret data. The CPU 102 is coupled to the memory management unit (MMU) 112 which manages access to memory 114, 116. The non-volatile memory 114 can contain secret data (e.g., a private key) used in the cryptographic operations.

The clock inputs 104a, 104b, 104c, are coupled to clock generators A, B, C, respectively. Other implementations can include more or fewer clock generators. In the example shown, clock inputs 104 are fed into multiplexer 110. The output of multiplexer 110 is coupled to the clock input of the CPU 102. Clock generator A provides a clock A (clk) for the DLFDs 106a, 106b, 106c, as described in reference to FIG. 2. The LFD 108 ensures that clock A is protected. The output of each DLFD 106 provides an active signal to indicate an active clock, as described in reference to FIG. 2.

Example Clock Detect Circuit

Figure 2:
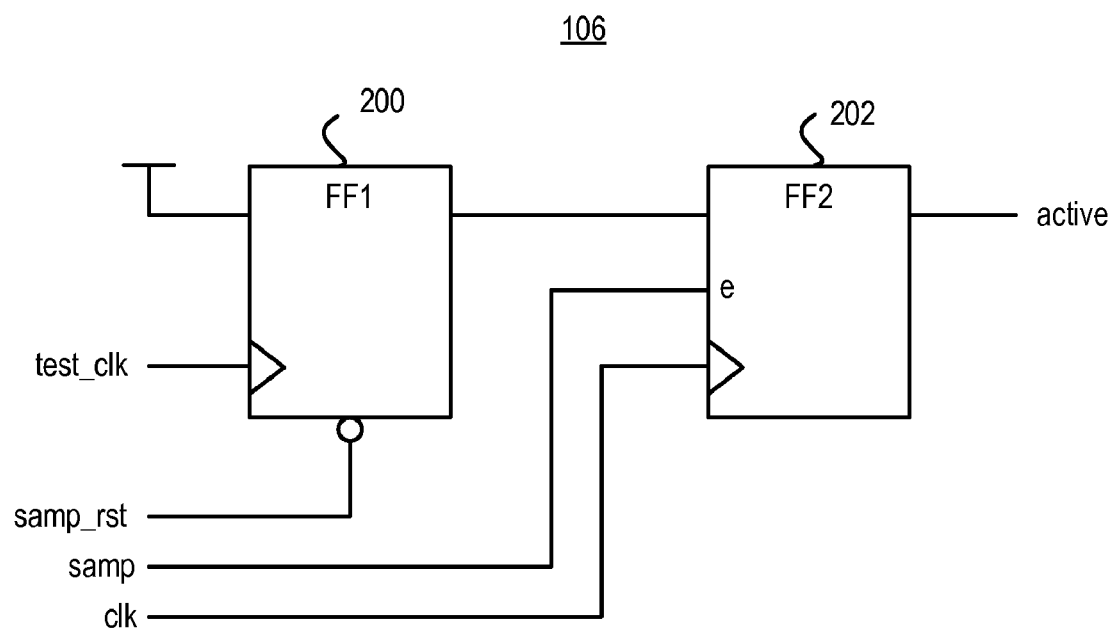
FIG. 2 is block diagram of an example clock detect circuit.

FIG. 2 is block diagram of an example DLFD 106. The DLFD 106 is used to detect clock activity. In some implementations, the DLFD 106 has four inputs: a test clock (test_clk), a sample reset signal (samp_rst), a sample signal (samp) and a protected clock signal (clk). The test_clk is the clock being tested (e.g., clock A, clock B or clock C), samp_rst resets the DLFD 106 before a next sampling period, samp is asserted at the end of the sample period, and clk is the protected clock used by the DLFD 106, as shown in FIG. 1.

In some implementations, the DLFD 106 includes two flip flops. A first flip flop 200 (FF1) detects activity on test_clk. FF1 200 is set when a positive edge (+ve) of test_clk is detected. FF1 200 is reset by samp_rst (e.g., when samp_rst is low). A second flip flop 202 (FF2) is coupled to the output of FF1 200 and is operable to sample the output of FF2 in response to the enable signal, samp. The output of FF2 202 is asserted as active if the positive edge of test_clk occurs between the release of samp_rst on FF1 200 and the enabling of FF2 202 by samp.

The flip flops FF1, FF2, can be standard R/S flip-flops. One or more gates can be added to FF1 200, FF2 202 as needed to provide the described functionality. The samp signal should be asserted long enough to capture the positive edge of test_clk. The operation of the DLFD 106 is described more fully in reference to FIG. 3.

Example Operation of Clock Detect Circuit

Figure 3:
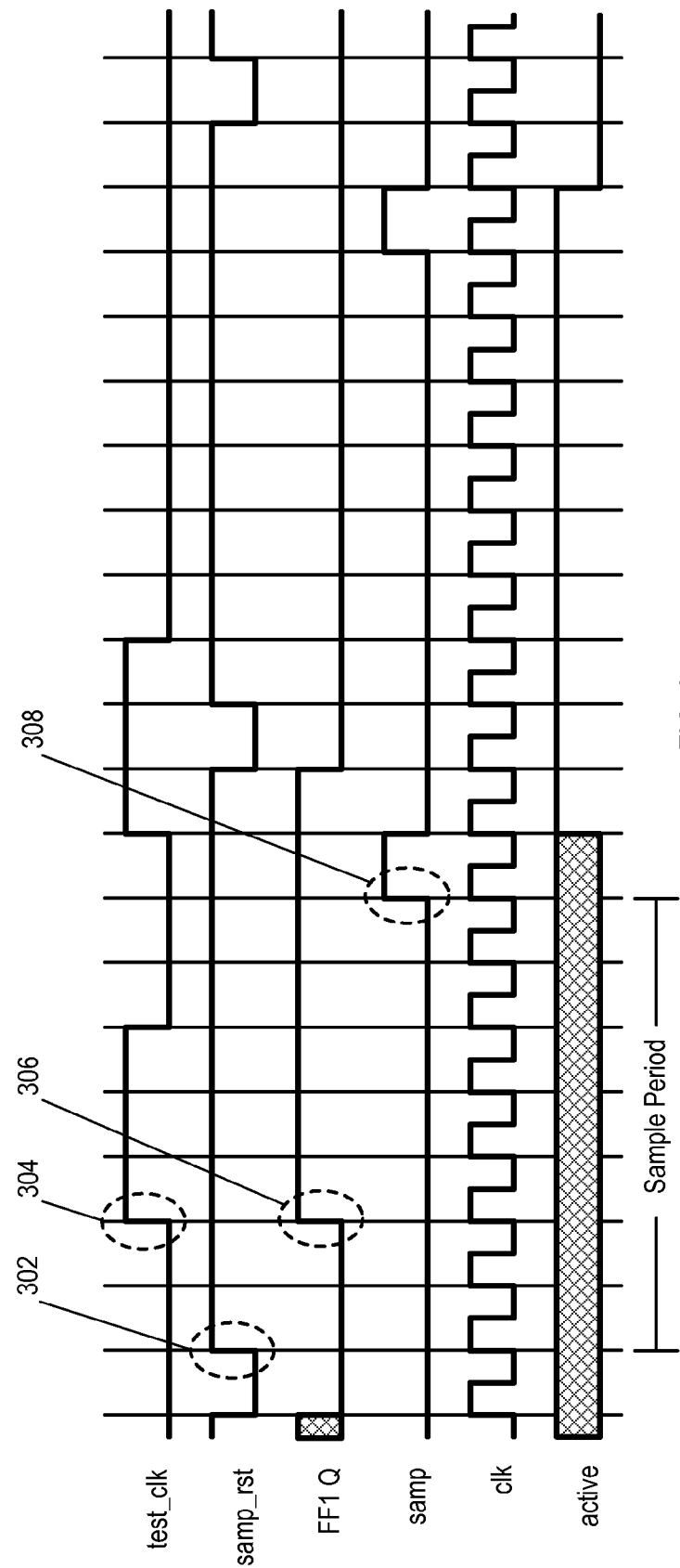
FIG. 3 is timing diagram illustrating the operation of the clock detect circuit of FIG. 2.

FIG. 3 is timing diagram illustrating the operation of the DLFD 106 of FIG. 2, both when tripped and not tripped. The clk (e.g., provided by clock A) can be derived from a clock pad, which can be protected by a low frequency detector (e.g., LFD 108). The sample period, defined from samp_rst to samp, is greater than the maximum sample period expected on test_clk. When determining the maximum sample period, allowances can be made for clock delaying components and errors, including but not limited to: clock dividers, clock stealers, cycles lost by internal/external clock multiplexers (e.g., multiplexer 110), sampling errors, etc.

Referring to FIG. 3, at the start of the second clk cycle, the samp_rst signal is asserted low causing FF1 to reset. The release of the samp_rst signal 302 starts the sample period. At the start of the fifth clk cycle, a positive edge 304 of test_clk is detected and FF1 output goes high 306. At the start of the tenth clk cycle, samp is asserted high 308, and the output of FF1 is pushed (sampled) to the output of FF2 (active) during the next clk cycle. The assertion of samp ends the sample period.

In this example, the FF2 output is active during the first ten clk cycles shown in FIG. 3. The sample period starts at the assertion of samp_rst and ends at the assertion of samp. Samp and samp_rst are each asserted low for one clock period. Samp is asserted high a sample period after samp_rst is asserted high. Samp_rst is asserted low one clk period after samp is asserted high. Preferably, samp_rst is glitch free as it feeds asynchronous flip flops.

Figure 4:
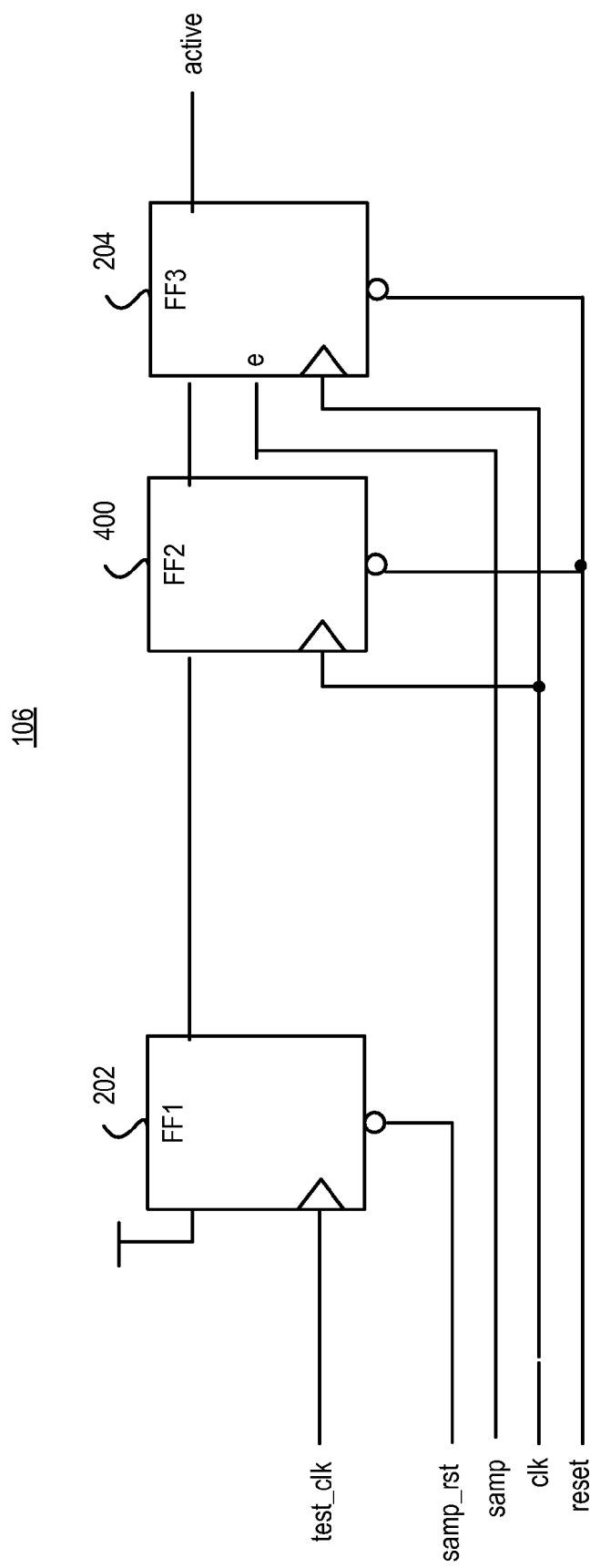
FIG. 4 is a block diagram of the clock detect circuit of FIG. 2, including an additional flip flop to control metastability.

FIG. 4 is a block diagram of an example DLFD 400, including an additional flip flop 402 to control metastability. The DLFD 400 operates in the same manner as the DLFD 106 in FIG. 2, except the additional flip flop 402 (FF2) is interposed between the output of FF1 202 and the input of FF2 204 to control metastability. An additional reset line has been added to reset FF2 and FF3 (e.g., reset at power up).

There are several advantages associated with the DLFDs 106, 400. For example, the DLFDs 106, 400 consume less IC die area than conventional solutions. The DLFDs 106, 400 can also be implemented as a standard cell and used with multiple clocks on the IC.

What is claimed is:

1. A digital low frequency detector, comprising:
    a first flip flop having a first input for receiving a test clock, a second input for receiving a reset signal and an output for providing an output signal indicating test clock activity, where the first flip flop is set by a positive edge of the test clock and reset by the reset signal; and
    a second flip flop having a first input coupled to the output of the first flip flop, a second input for receiving an enable signal, and a third input for receiving a clock signal that is independent of the test clock signal, the second flip flop operable for sampling the output of the first flip flop, and having an output for providing a signal indicative of test clock activity if the positive edge of the test clock occurs between a release of the reset signal on the first flip flop and an assertion of an enabling signal on the second flip flop.

2. The clock detect circuit of claim 1, further comprising:
    a third flip flop interposed between the output of the first flip and the first input of the second flip flop to control metastability for the digital low frequency detector.

3. A method implemented by a digital low frequency detector, comprising:
    receiving an assertion of a reset signal on a first flip flop of the digital low frequency detector, the first flip flop coupled to a test clock;
    detecting at an input of the first flip flop a positive edge of the test clock;
    responsive to detecting the positive edge of the test clock, setting an output of the first flip flop;
    receiving an assertion of a sample signal on a second flip flop of the digital low frequency detector, an input of the second flip flop coupled to the output of the first flip flop; and
    responsive to receiving the sample signal, transferring the output of the first flip flop to an output of the second flip flop, wherein the output of the second flip flop indicates test clock activity if the positive edge of the test clock occurs between a release of the reset signal on the first flip flop and the assertion of the sample signal on the second flip flop.

4. A system for detecting clock activity, comprising:
    a processor coupled to a test clock;
    a digital low frequency detector coupled to the test clock and the processor, where the digital low frequency detector is operable for:
        receiving an assertion of a reset signal on a first flip flop of the digital low frequency detector, the first flip flop coupled to the test clock;
        detecting at an input of the first flip flop a positive edge of the test clock;
        responsive to detecting the positive edge of the test clock, setting an output of the first flip flop;
        receiving an assertion of a sample signal on a second flip flop of the digital low frequency detector, an input of the second flip flop coupled to the output of the first flip flop; and
        responsive to receiving the sample signal, transferring the output of the first flip flop to an output of the second flip flop, wherein the output of the second flip flop is coupled to the processor for indicating test clock activity if the positive edge of the test clock occurs between a release of the reset signal on the first flip flop and the assertion of the sample signal on the second flip flop.

5. The system of claim 4, further comprising:
    a third flip flop interposed between the output of the first flip and the input of the second flip flop to control metastability for the digital low frequency detector.

* * * * *

UNITED STATES PATENT AND TRADEMARK OFFICE
CERTIFICATE OF CORRECTION

PATENT NO. : 7,710,161 B1
APPLICATION NO. : 12/353158
DATED : May 4, 2010
INVENTOR(S) : Colin Bates Page 1 of 1

It is certified that error appears in the above-identified patent and that said Letters Patent is hereby corrected as shown below:

On the Cover Page, (57) Abstract, line 12, replace:
"or more additional flips can be interposed between the first" with
-- or more additional flip flops can be interposed between the first --

On the Cover Page, (57) Abstract, line 13, replace:
"and second flips to control metastability." with
-- and second flip flops to control metastability. --

Column 1, Line 56; replace:
"some implementations, one or more additional flips can be" with
-- some implementations, one or more additional flip flops can be --

Column 1, Line 57; replace:
"interposed between the first and second flips to control meta-" with
-- interposed between the first and second flip flops to control meta- --

Column 4, Line 8 at Claim 2; replace:
"flip and the first input of the second flip flop to control" with
-- flip flop and the first input of the second flip flop to control --

Column 4, Line 56 at Claim 5; replace:
"flip and the input of the second flip flop to control meta-" with
-- flip flop and the input of the second flip flop to control meta- --

Signed and Sealed this
Twenty-eighth Day of December, 2010

David J. Kappos
*Director of the United States Patent and Trademark Office*